(12) United States Patent
Lu et al.

(10) Patent No.: US 11,856,757 B2
(45) Date of Patent: Dec. 26, 2023

(54) METHOD FOR MANUFACTURING SEMICONDUCTOR STRUCTURE WITH CAPACITOR WIRES

(71) Applicant: CHANGXIN MEMORY TECHNOLOGIES, INC., Hefei (CN)

(72) Inventors: Jingwen Lu, Hefei (CN); Hai-Han Hung, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 210 days.

(21) Appl. No.: 17/400,442

(22) Filed: Aug. 12, 2021

(65) Prior Publication Data

US 2022/0045070 A1 Feb. 10, 2022

Related U.S. Application Data

(63) Continuation of application No. PCT/CN2021/099716, filed on Jun. 11, 2021.

(30) Foreign Application Priority Data

Aug. 4, 2020 (CN) .......................... 202010771964.1

(51) Int. Cl.
H10B 12/00 (2023.01)
(52) U.S. Cl.
CPC ......... *H10B 12/485* (2023.02); *H10B 12/482* (2023.02)
(58) Field of Classification Search
CPC .. H01L 12/485; H01L 12/482; H01L 438/637
USPC ....................................................... 438/637
See application file for complete search history.

(56) References Cited

U.S. PATENT DOCUMENTS

| 9,337,203 B2 | 5/2016 | Hwang et al. |
| 9,620,451 B2 | 4/2017 | Hwang et al. |
| 2015/0255466 A1* | 9/2015 | Hwang .............. H10B 12/50 438/586 |

(Continued)

FOREIGN PATENT DOCUMENTS

| CN | 107482007 A | 12/2017 |
| CN | 107611133 A | 1/2018 |
| CN | 107845633 A | 3/2018 |

(Continued)

*Primary Examiner* — Sheng-Bai Zhu
(74) *Attorney, Agent, or Firm* — Cooper Legal Group, LLC

(57) ABSTRACT

A semiconductor structure manufacturing method includes that a substrate is provided, in which the substrate includes a substrate layer and a plurality of bit line structures arranged on the substrate layer in a first direction, the substrate layer includes shallow trench isolation structures, active areas, and a plurality of word line structures arranged in a second direction, and two adjacent bit line structures and two adjacent word line structures define a conductive contact region, and the conductive contact region exposing part of a corresponding active area; a conducting layer is formed between the bit line structures, the conducting layer covering the substrate layer, and the conducting layer extending along the first direction; part of the conducting layer is removed with the conducting layer corresponding to the conductive contact region retained to form first capacitor wires; and an isolation layer is formed, which fills gaps between the first capacitor wires.

10 Claims, 29 Drawing Sheets

(56) References Cited

U.S. PATENT DOCUMENTS

2016/0225710 A1    8/2016  Hwang et al.

FOREIGN PATENT DOCUMENTS

| CN | 111463208 A |   | 7/2020 |
|----|-------------|---|--------|
| JP | H0449655    | * | 2/1992 |
| JP | 2002237525  | * | 8/2003 |

* cited by examiner

METHOD FOR MANUFACTURING SEMICONDUCTOR STRUCTURE WITH CAPACITOR WIRES

CROSS-REFERENCE TO RELATED APPLICATION

This application is a continuation application of International Application No. PCT/CN2021/099716 filed on Jun. 11, 2021, which claims priority to Chinese Patent Application No. 202010771964.1, filed on Aug. 4, 2020. International Application No. PCT/CN2021/099716 and Chinese Patent Application No. 202010771964.1 are hereby incorporated by reference in their entirety.

BACKGROUND

Dynamic Random Access Memory (DRAM) is a semiconductor storage device often used in computers, and a storage array region consists of many duplicated storage units. Each storage unit usually includes a capacitor and a transistor. A gate of the transistor is connected with a word line structure, either a drain or a source is connected with a bit line structure, the other is connected with the capacitor. A voltage signal on the word line structure controls the transistor to be turned on or turned off to further read data information stored in the capacitor through the bit line structure or write data information in the capacitor for storage through the bit line structure.

A method for conductively connecting the capacitor with the drain or source of the transistor of the DRAM is connecting through a polysilicon-metal pin. When a manufacturing process of the semiconductor storage device shrinks, a size of the polysilicon-metal pin is reduced. The electrical conductivity of the polysilicon-metal pin and contact resistance thereof with the drain or the source become important factors that affect the electrical performance of the semiconductor structure.

SUMMARY

The disclosure relates to the field of semiconductor manufacture, and particularly to a semiconductor structure manufacturing method.

The embodiments of the disclosure provide a semiconductor structure manufacturing method, which may include operations as follows. A substrate is provided, which includes a substrate layer and a plurality of bit line structures arranged on the substrate layer in a first direction. The substrate layer includes shallow trench isolation structures, active areas defined by the shallow trench isolation structures, and a plurality of word line structures arranged in a second direction. The word line structures pass through the shallow trench isolation structures and the active area. Two adjacent bit line structures and two adjacent word line structures define a conductive contact region which exposes a part of a corresponding active area. A conducting layer is formed between the bit line structures. The conducting layer covers the substrate layer, and the conducting layer extends along the first direction. The conducting layer is partially removed that the conducting layer corresponding to the conductive contact region is retained to form first capacitor wires. An isolation layer is formed, which fills gaps between the first capacitor wires.

DETAILED DESCRIPTION

The examples of a semiconductor structure manufacturing method provided in the embodiments of the disclosure will be described below in detail in combination with the drawings.

In the related art, a polysilicon-metal pin is formed by forming a capacitive contact hole at first, and then depositing polysilicon and a metal conducting material in the capacitive contact hole to form the polysilicon-metal pin. However, with shrinking of the manufacturing process of a semiconductor storage device, the size of the polysilicon-metal pin is also reduced, thus the electrical conductivity of such semiconductor structure adopting the polysilicon-metal pin is poor. Researches find that such a situation is caused by the following reasons. On one hand, an air gap may be formed inside polysilicon when it is deposited, the air gap may reduce the electrical conductivity of the polysilicon-metal pin and with the reduction of the size of the polysilicon-metal pin, and the gap may affect the electrical conductivity more apparently. On the other hand, a size of the capacitor contact hole may also be reduced, and the reduction of the size of the capacitor contact hole makes the deposited polysilicon unable to completely contact with an active area, thereby forming a poor contact and further increasing the contact resistance. The electrical performance of the semiconductor structure is affected accordingly.

Based on the foregoing problems in the related art, the embodiments of the disclosure provide a semiconductor structure manufacturing method. Formation of an air gap in polysilicon can be avoided, a contact area of the polysilicon with an active area is enlarged, and the electrical performance of a semiconductor structure is improved.

Figure 1:
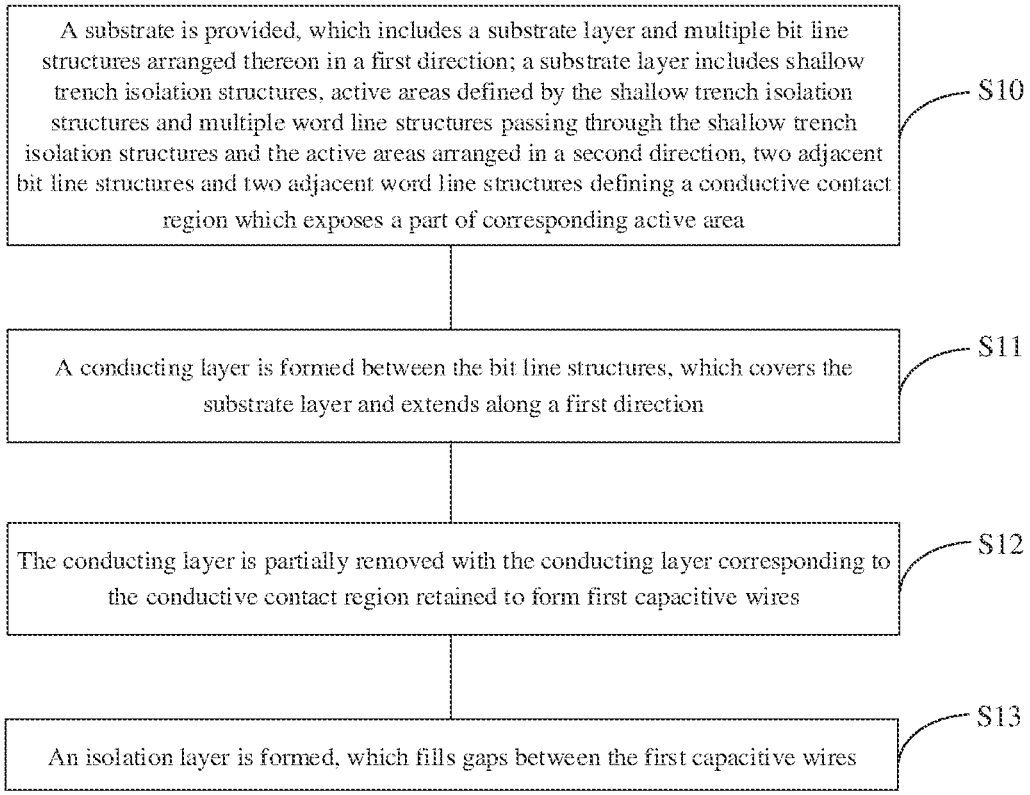
FIG. 1 is a schematic chart of operations of an example of a semiconductor structure manufacturing method according to an embodiment of the disclosure.

FIG. 1 is a schematic diagram of operations of an example of a semiconductor structure manufacturing method according to an embodiment of the disclosure. Referring to FIG. 1, the semiconductor structure manufacturing method provided in the example of the disclosure includes the following operations. In S10, a substrate is provided. The substrate includes a substrate layer and a plurality of bit line structures arranged on the substrate layer in a first direction. The substrate layer includes shallow trench isolation structures, active areas defined by the shallow trench isolation structures, and a plurality of word line structures arranged in a second direction. The word line structures pass through the shallow trench isolation structures and the active areas. Two adjacent bit line structures and two adjacent word line structures define a region of a conductive contact region, which exposes a part of a corresponding active area. In S11, a conducting layer is formed between the bit line structures, which covers the substrate layer, and extends along the first direction. In S12, the conducting layer is partially removed such that the conducting layer corresponding to the conductive contact regions is retained so as to form first capacitor wires. In S13, an isolation layer is formed, which fills gaps between the first capacitor wires.

FIG. 2 to FIG. 29 are diagrams showing the process flowchart of an example of a semiconductor structure manufacturing method according to an embodiment of the disclosure.

Figure 2:
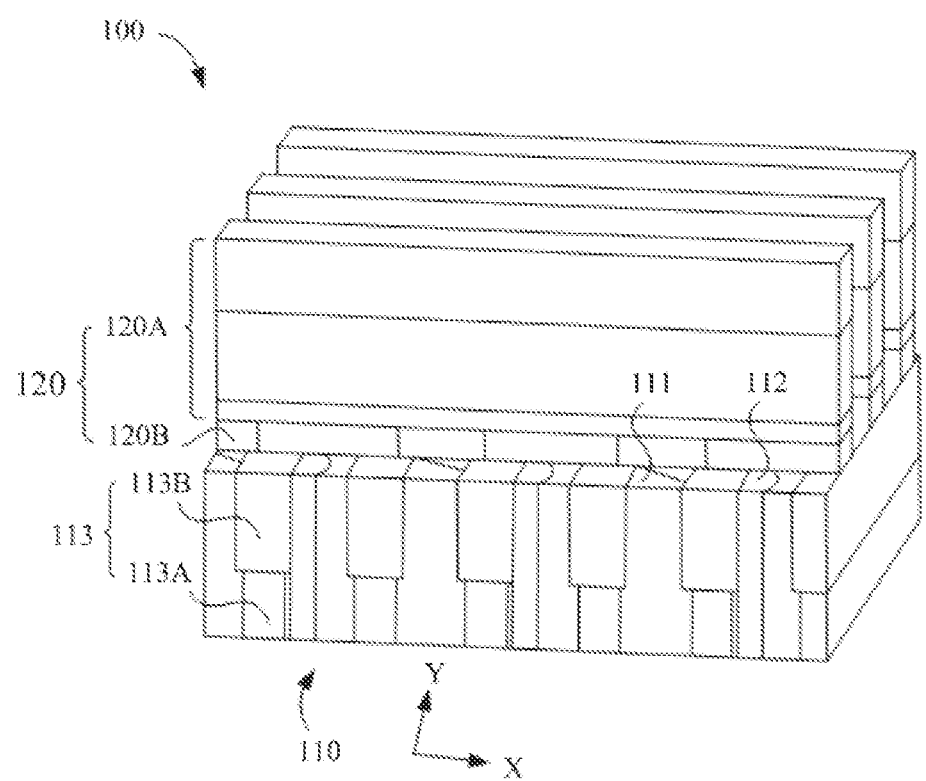
FIG. 2 to FIG. 29 are diagrams showing the processing flowchart of an example of a semiconductor structure manufacturing method according to an embodiment of the disclosure.
Figure 3:
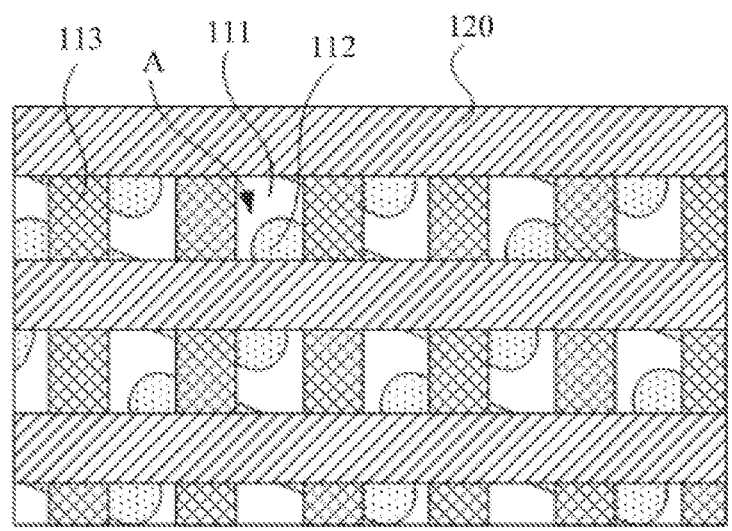

References are made to S10, FIG. 2 and FIG. 3. FIG. 3 is a top view of the structure shown in FIG. 2. A substrate 100 is provided. The substrate 100 includes a substrate layer 110 and a plurality of bit line structures 120 arranged on the substrate layer 110 in a first direction (an X direction). The substrate layer 110 includes shallow trench isolation structures 111, active areas 112 defined by the shallow trench isolation structures 111, and a plurality of word line structures 113 arranged in a second direction (a Y direction). A word line structure 113 passes through the shallow trench isolation structures 111 and the active areas 112. A region defined by two adjacent bit line structures 120 and two adjacent word line structures 113 is a conductive contact region A. The conductive contact region A exposes a part of each active area 112.

FIG. 2 and FIG. 3 schematically show three bit line structures 120. One bit line structure 120 includes a bit line 120A and a plurality of bit line contact islands 120B. The bit line contact islands 120B are insulated from one another. The bit line 120A is electrically connected with the active areas 112 through the bit line contact islands 120B. It can be understood that the number of the bit line structures 120 is not limited thereto and may be set by those skilled in the art as practically required.

In the examples of the disclosure, an active area 112 is formed by the following method. A trench is formed in a silicon substrate, the shallow trench isolation structure 111 is formed in the trench, and the silicon substrate isolated by the shallow trench isolation structure 111 is determined as the active area 112. The shallow trench isolation structure 111 may be formed by depositing a material such as silicon oxide and nitride.

FIG. 2 and FIG. 3 schematically show five word line structures 113. One word line structure 113 includes a word line 113A and a passivated layer 113B covering the word line 113A. The passivated layer 113B is exposed from a surface of the substrate layer 110, and a part of the passivated layer 113B is covered with the word line structure 120. It can be understood that the number of the word line structures 113 is not limited thereto and may be set by those skilled in the art as practically required.

The bit line structures 120 extend along the first direction (the X direction), and the word line structures 113 extend along the second direction (the Y direction), and both pass through the shallow trench isolation structures 111 and the active areas 112. In the examples of the disclosure, the first direction is perpendicular to the second direction. It can be understood that the disclosure is not limited thereto. In another example, the first direction may form an angle with the second direction which is other than 90°.

In the substrate 100, the area of an active area, that a word line structure 113 passes through, is used as a gate of a metal oxide semiconductor (MOS) transistor. The area of the active area 112 corresponding to the bit line structure 120 is used as either a source or drain of the MOS transistor, and the area of the active area 112 corresponding to the conductive contact region A is used as the other one of the drain or source of the MOS transistor.

In some examples, after S10, the manufacturing method further includes the following operations.

Figure 4:
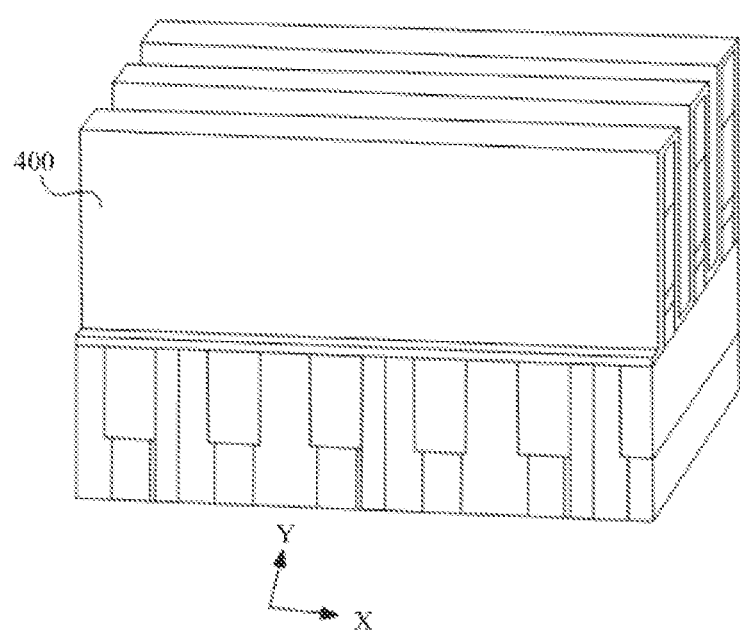

Referring to FIG. 4, a protective layer material 400 is deposited. The protective layer material 400 covers the surface of the bit line structures 120 and the surface of the substrate layer 110. The protective layer material 400 may be deposited by the atomic layer deposition (ALD) process. The protective layer material 400 deposited by the ALD process has a dense structure, and has a better function of isolation. In the examples of the disclosure, the protective layer material 400 may be a silicon nitride layer. In another example, the protective layer material 400 may be a silicon nitride-silicon oxide-silicon nitride composite layer.

Figure 5:
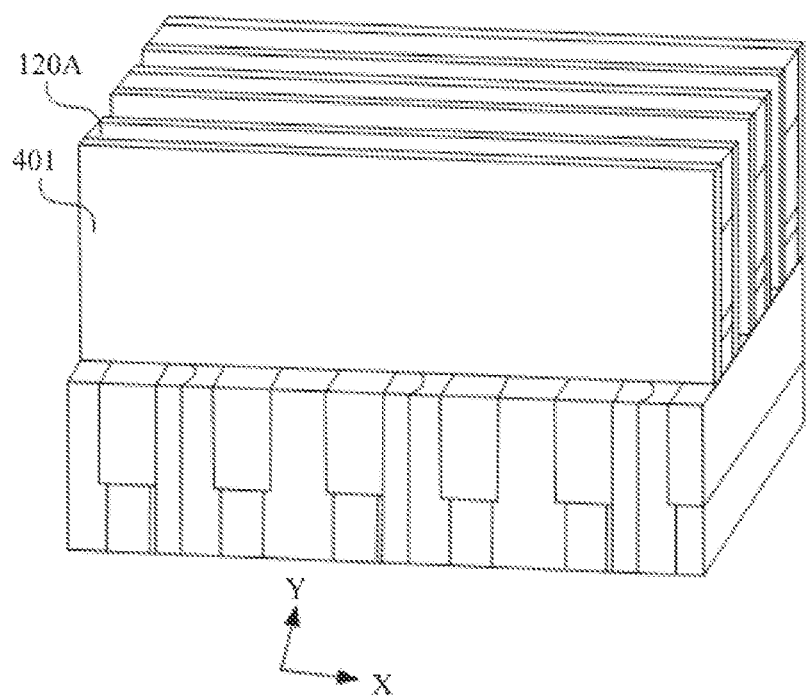
Figure 6:
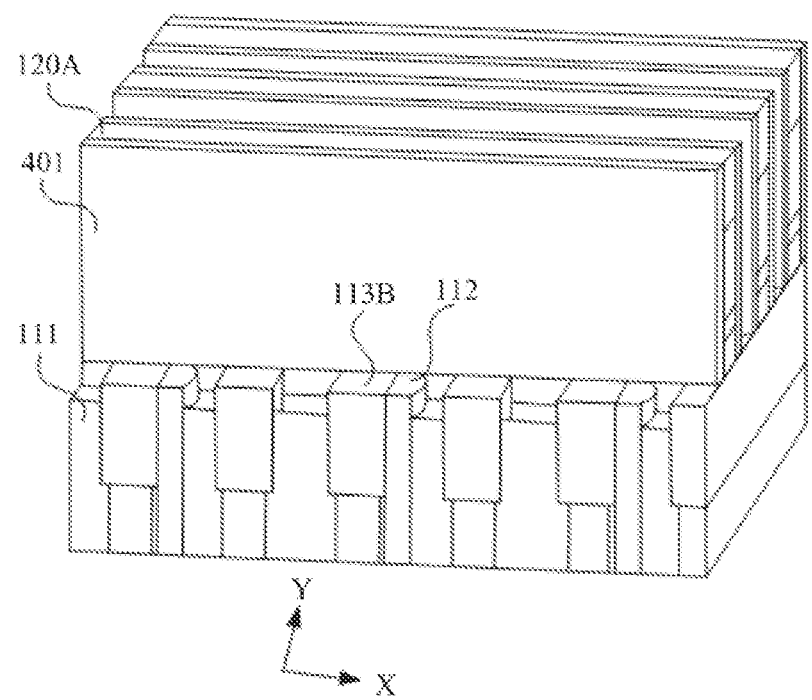

Referring to FIG. 5, the protective layer material 400 is partially removed with a protective layer 401 on sidewalls of the bit line structures 120 retained. The protective layer 401 may isolate the bit lines 120A from the outside to protect the bit line 120A from being oxidized.

Figure 20:
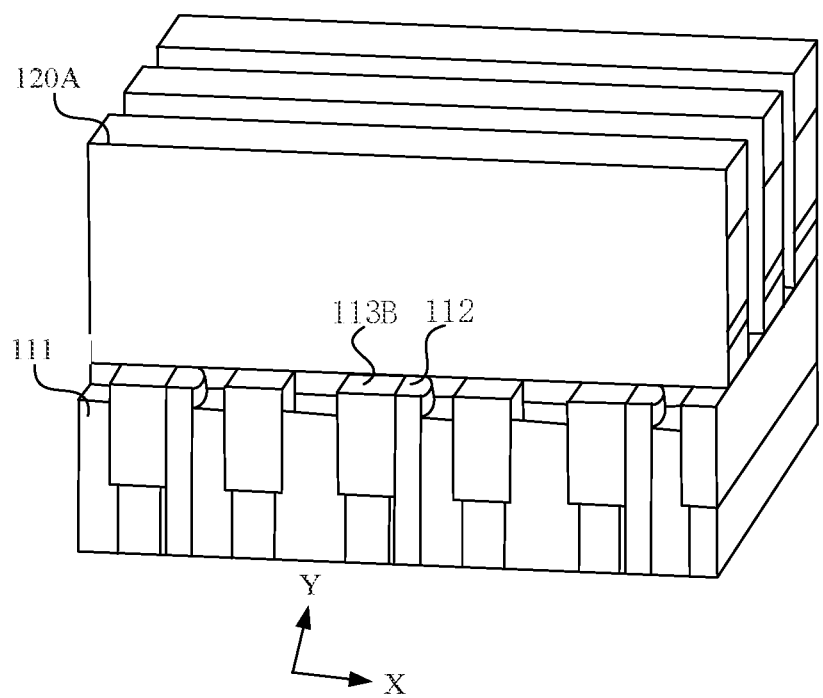
Figure 21:
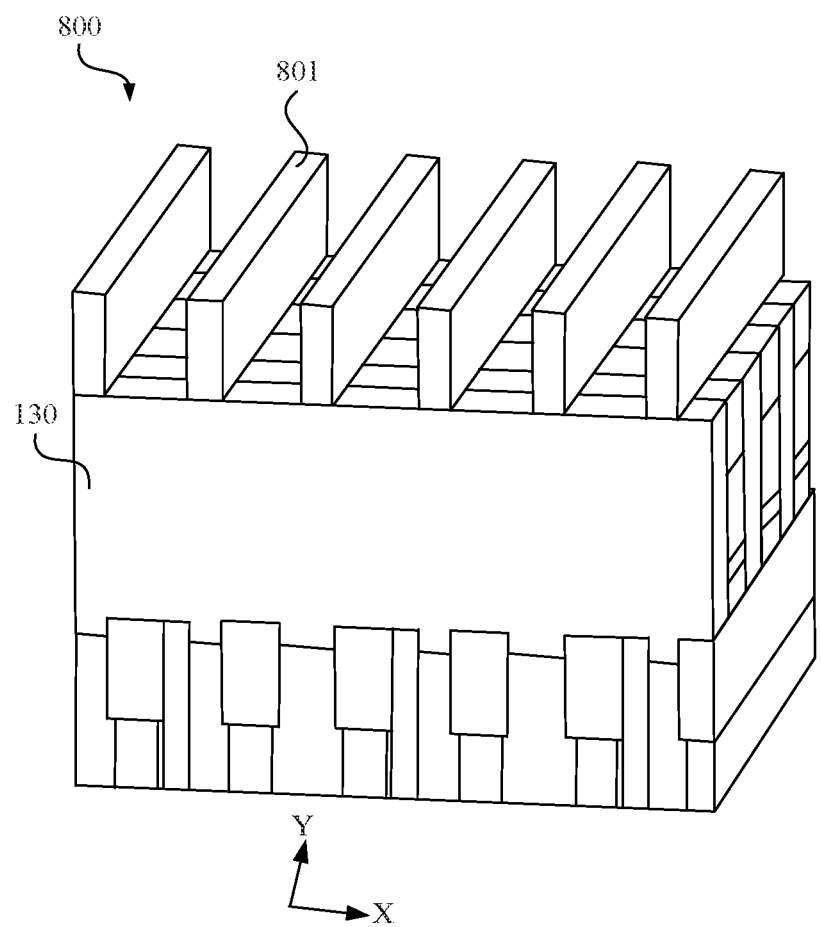
Figure 22:
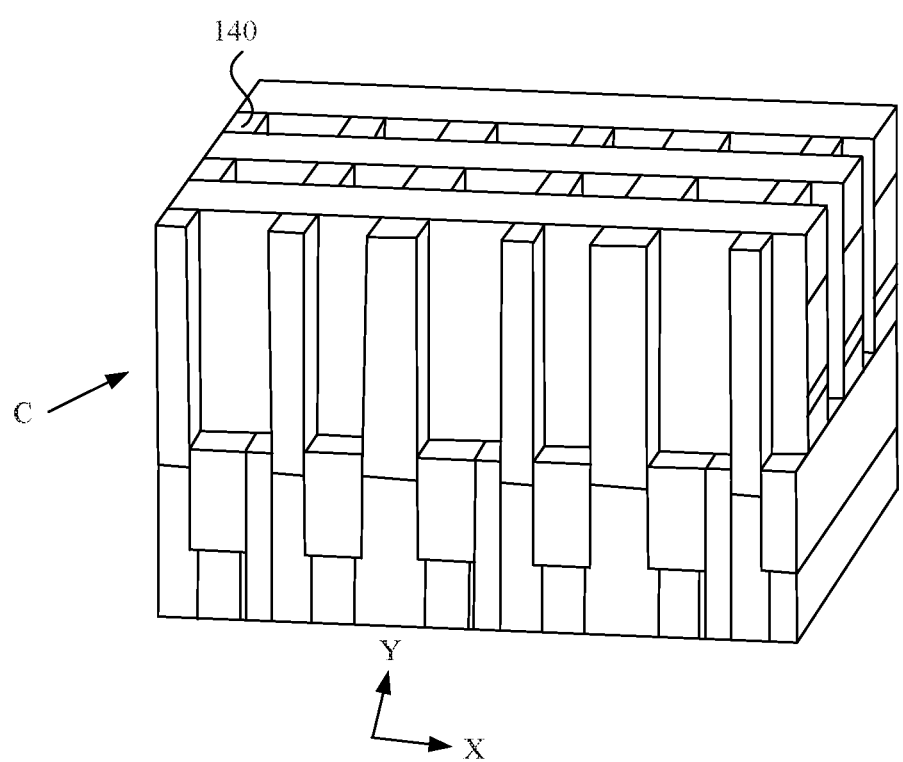
Figure 23:
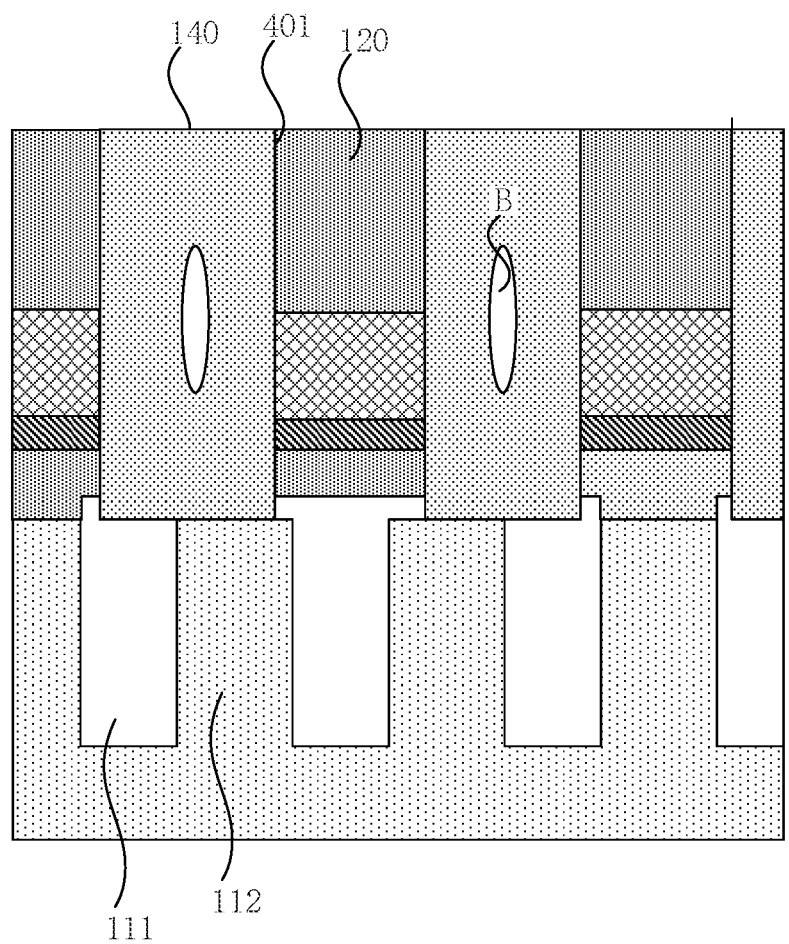

In some examples, after S10, the substrate layer 110 that is not covered with the bit line structures 120 may be etched to remove part of the shallow trench isolation structure 111 to enlarge an area of an active area 112 exposed from the conductive contact region A and further enlarge a contact area of a first capacitor wire that is subsequently formed with the active area 112, thereby reducing the contact resistance. In the examples of the disclosure, the protective layer material 400 is partially removed by etching until the surface of the substrate 110 is exposed. Then, referring to FIG. 6, the shallow trench isolation structures 111 are over-etched such that the word line structures 113 and the active areas 112 protrude and the areas of the active areas 112 exposed from the conductive contact regions A are further enlarged. At this operation, an etching solution of which an etching rate for the shallow trench isolation structures 111 is higher than an etching rate for the word line structures 113 and the active areas 112 may be selected, such that the shallow trench isolation structures 111 are mainly removed and the word line structures 113 and the active areas 112 are retained. In another example, if the protective layer 401 is not formed, on a structure formed in S10, the substrate layer that is not covered with the bit line structures may be etched directly to remove part of the shallow trench isolation structures 111, as shown in FIG. 20.

Figure 7:
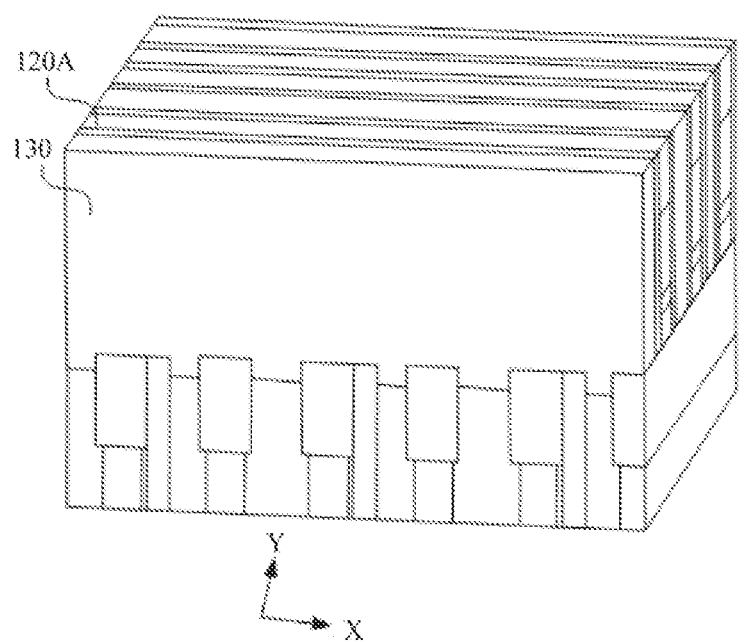

Referring to S11 and FIG. 7, a conducting layer 130 is formed between the bit line structures 120. The conducting layer 130 covers the substrate layer 110, and extends along the first direction (the X direction). Since the bit line structure 120 extends along the first direction (the X direction), a spacing between the bit line structures 120 also extends along the first direction (the X direction), and the formed conducting layer 130 also extends along the first direction (the X direction).

At this operation, the conducting layer 130 may be formed by depositing a conducting material by a low-pressure chemical vapor deposition (LPCVD) process. The conducting layer 130 includes, but not limited to, a polysilicon layer.

It can be understood that, for filling a region between the bit line structures 120 with the conducting layer 130, when the conducting layer is formed, the conducting material not only fills a portion between the bit line structures 120 but also covers top surfaces of the bit line structures 120. After filling with the conducting material, the conducting material is partially removed by etching or other methods until the top surfaces of the bit line structures 120 are exposed therefore a top surface of the conducting layer 130 flush with the top surfaces of the bit line structures 120.

Referring to S12, FIG. 8 and FIG. 9, FIG. 21 and FIG. 22, the conducting layer 130 is partially removed with the conducting layer corresponding to the conductive contact region A retained to form first capacitor wires 140.

At this operation, the conducting layer 130 is partially removed by the following method.

Figure 8:
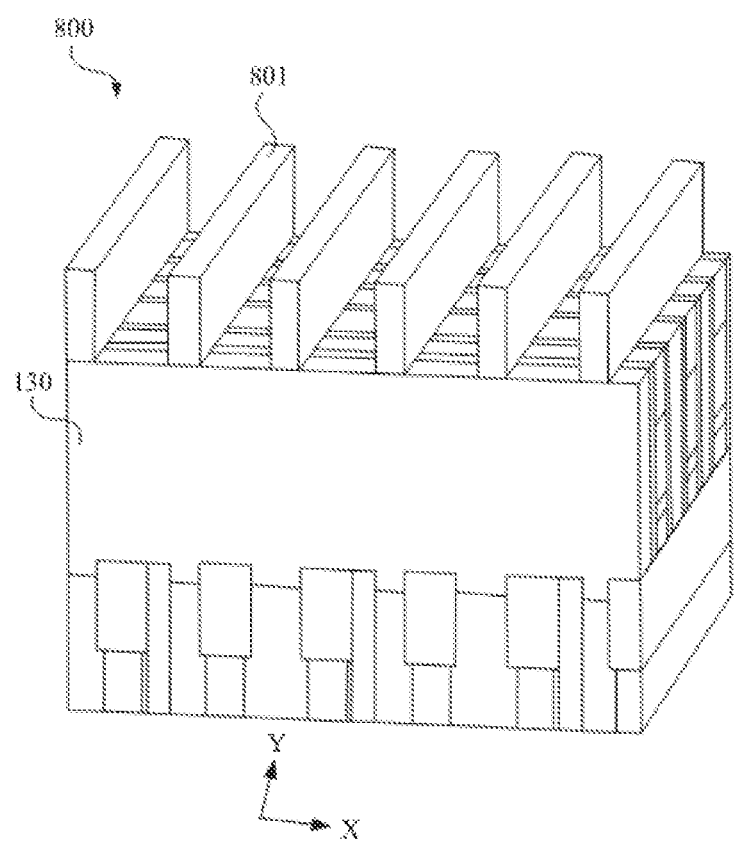

Referring to FIG. 8, a patterned photoresist layer 800 is formed on a plane formed by the conducting layer 130 and the bit line structures 120. The photoresist layer 800 has a plurality of photoresist strips 801, each photoresist strip 801 extends along the second direction (the Y direction), and passes over the conductive contact regions A. It is to be noted that FIG. 8 only shows a limited number of photoresist strips 801. It can be understood that the number of the photoresist strips 801 is not limited thereto and may be practically set by those skilled in the art as practically required. At this operation, the photoresist strip 801 covers the region of the conducting layer 130 that is required to be subsequently retained, and a region of the conducting layer 130 that is required to be subsequently removed is exposed.

Figure 9:
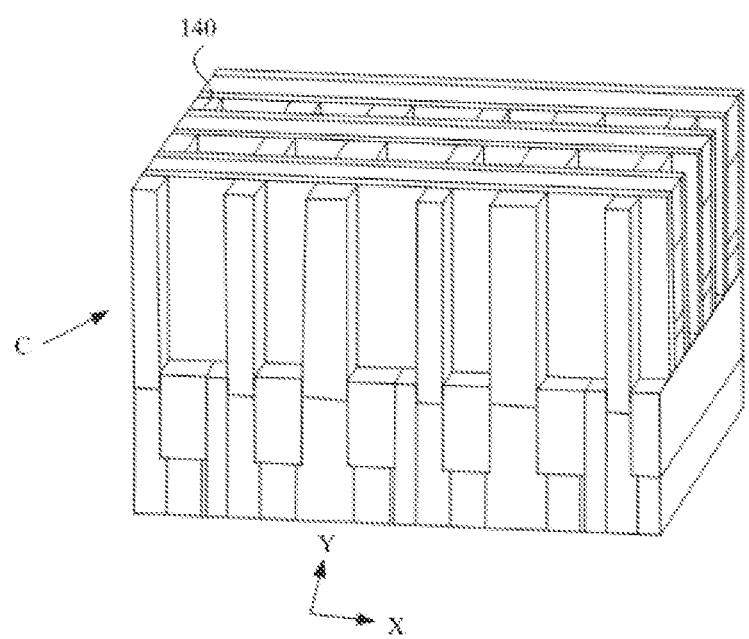

Referring to FIG. 9, the exposed conducting layer 130 is removed by taking the photoresist strips 801 as a mask. After the conducting layer 130 is removed, the substrate layer 110 is exposed. At this operation, the conducting layer 130 covered with the photoresist strips 801 is retained as the first capacitor wires 140. It can be understood that, when the conducting layer 130 is removed, part of top layers of the bit lines 120A are also removed (not shown in the figure) under the action of the etching solution. The top layers of the bit lines 120A may be a silicon nitride layer. After the exposed conducting layer 130 is removed, the photoresist strips 801 are also removed, to form the first capacitor wires 140.

Figure 10:
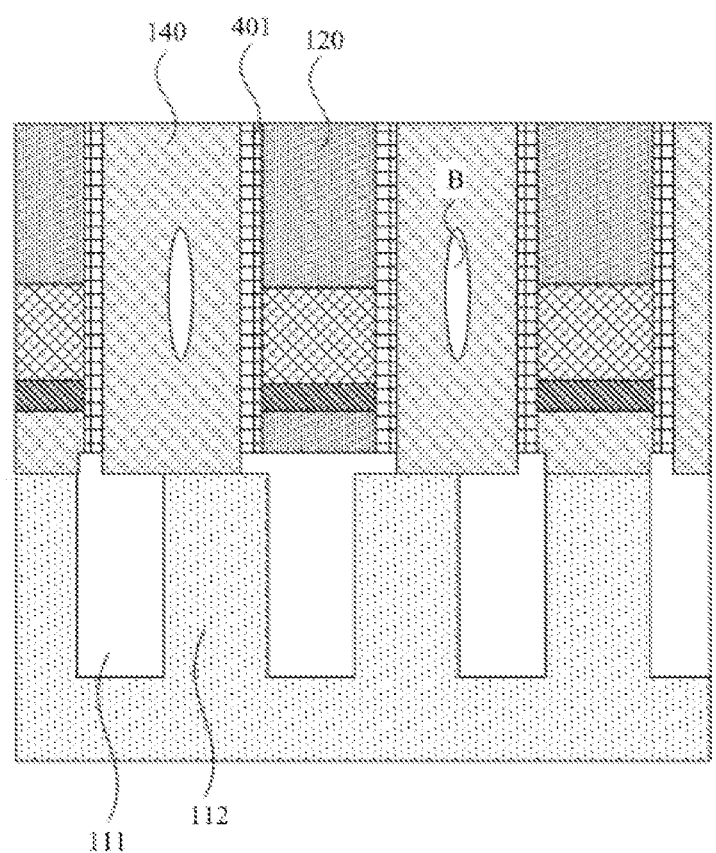

When the conducting layer 130 is deposited, gaps may be formed in the conducting layer 130 due to the limitation of a deposition process. Referring to FIG. 10 which is a schematic diagram of a lateral surface C of a structure shown in FIG. 9, and referring to FIG. 23 which is a schematic diagram of a lateral surface C of a structure shown in FIG. 22, air gaps B are formed in the conducting layer 130. The air gaps may affect the electrical performance of the conducting layer 130. In the related art, air gaps may also be formed when the conducting layer is deposited. Since the conducting layer is directly used as a capacitor wire without an additional treatment in a subsequent process, the air gaps always exist. In the manufacturing method of the disclosure, after the conducting layer 130 is formed, the conducting layer 130 is partially removed (the operation shown in FIG. 9), and then the air gaps B are exposed and eliminated with a treatment thereto.

Referring to S13, FIG. 11, FIG. 12, FIG. 13, FIG. 24 and FIG. 25, an isolation layer 150 is formed. The isolation layer 150 fills gaps between the first capacitor wires 140.

In the examples of the disclosure, a method for forming the isolation layer 150 includes the following operations.

Figure 11:
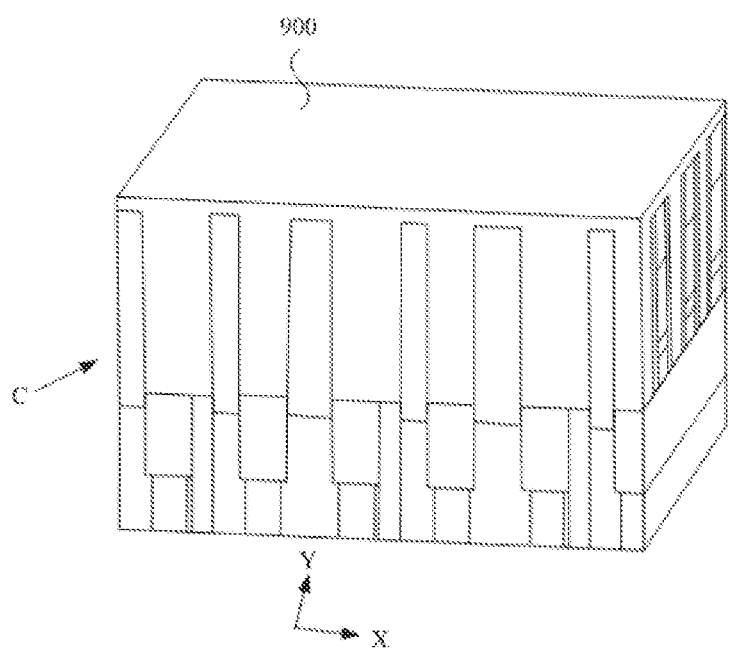
Figure 12:
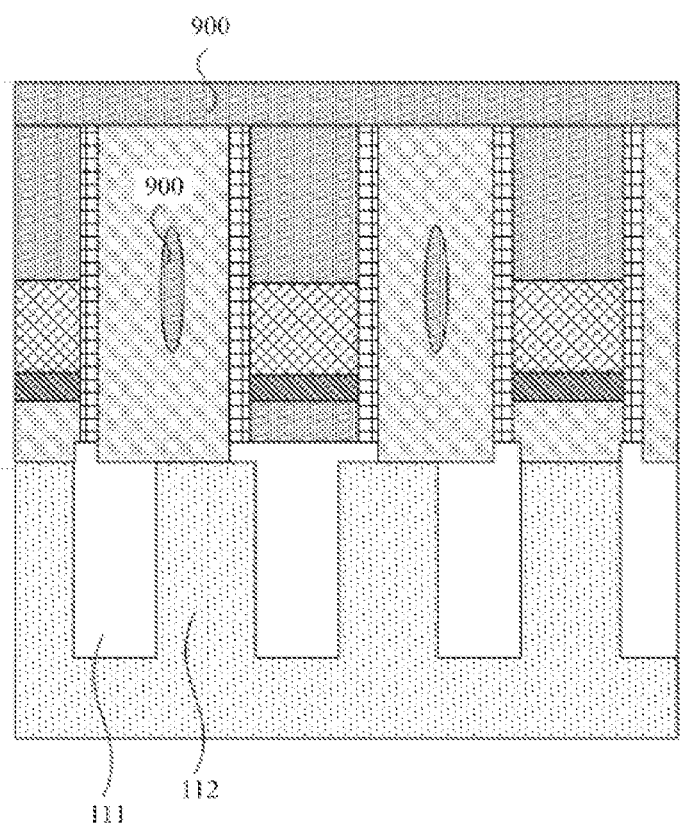
Figure 24:
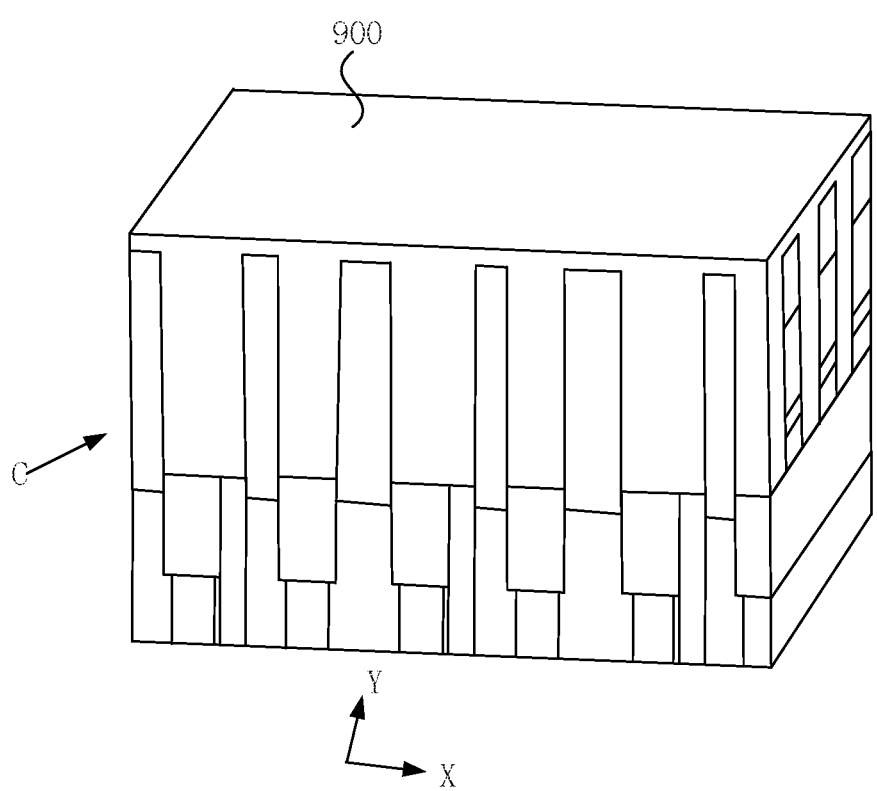

References are made to FIG. 11, FIG. 12, and FIG. 24. FIG. 12 is a schematic diagram of a lateral surface C of a structure shown in FIG. 11. Filling with an isolation layer material 900 is performed. The isolation layer material 900 fills the gaps between the first capacitor wires 140, and covers surfaces of the first capacitor wires 140 and the bit line structures 120. Since the air gaps B are exposed, the isolation layer material 900 fills the air gaps B to eliminate them. In such a case, if etching-back treatment is subsequently performed on the first capacitor wires 140, the air gaps B may not be enlarged, so that the electrical performance of the first capacitor wires 140 is further improved. In the examples of the disclosure, the isolation layer material 900 may be deposited using an ALD process, and the deposited isolation layer material 900 has a dense structure and has a good isolation performance. The isolation layer material 900 may be an insulating material such as silicon nitride.

Figure 13:
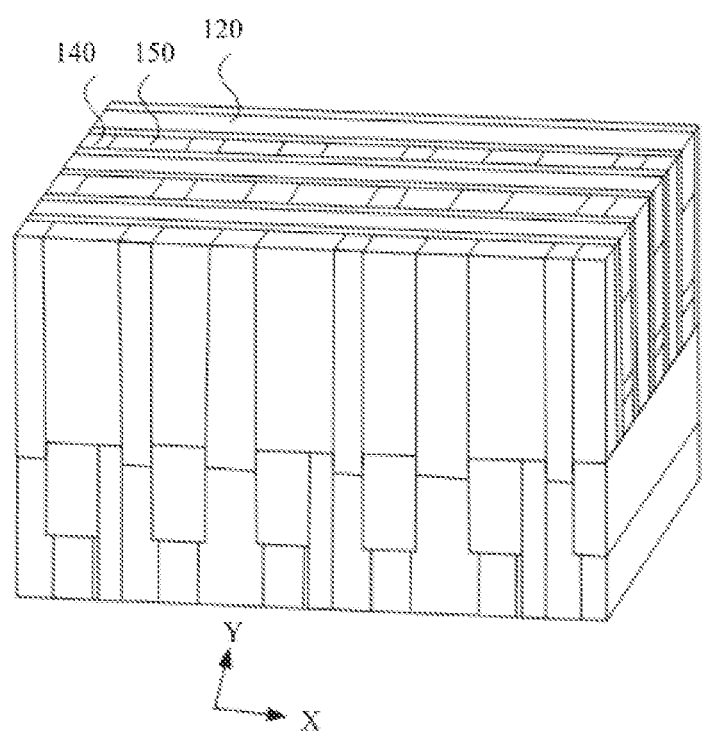
Figure 25:
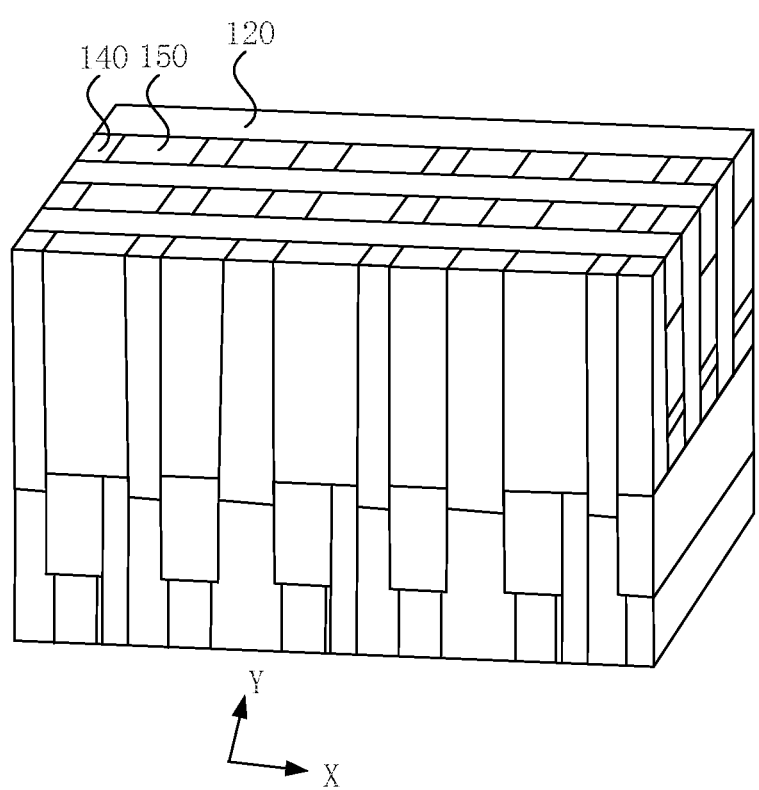

Referring to FIG. 13 and FIG. 25, the isolation layer material on the surfaces of the first capacitor wires 140 and the bit line structures 120 is removed to form the isolation layers 150. The isolation layers 150 are used as an isolation structure between the first capacitor wires 140. The first capacitor wires 140 and the bit line structures 120 are exposed.

After the operation that the isolation layer 150 is formed, the semiconductor structure manufacturing method further includes the following operations.

Figure 26:
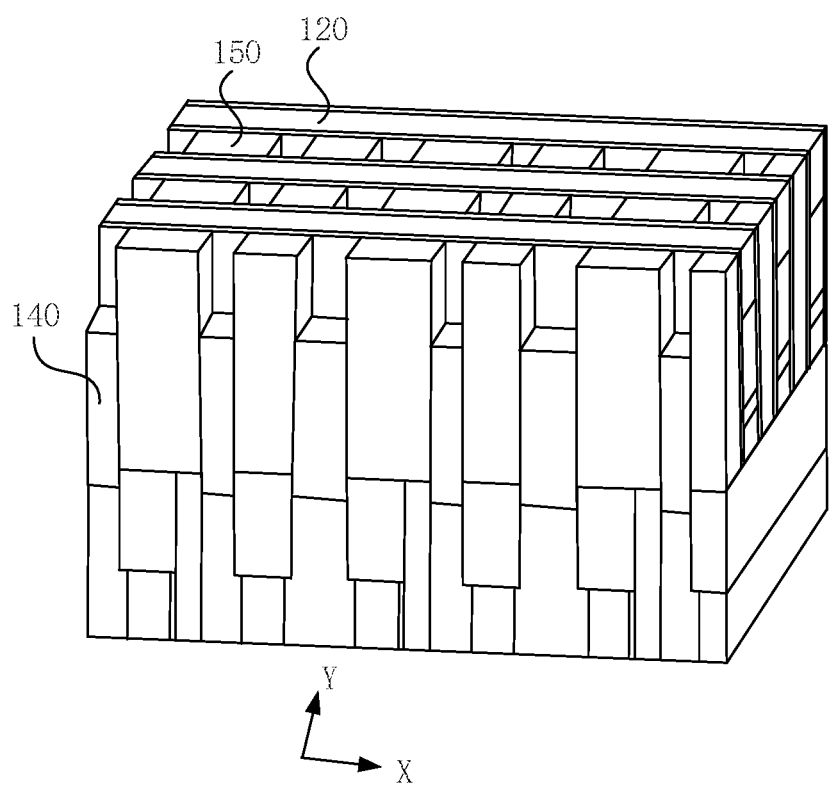
Figure 27:
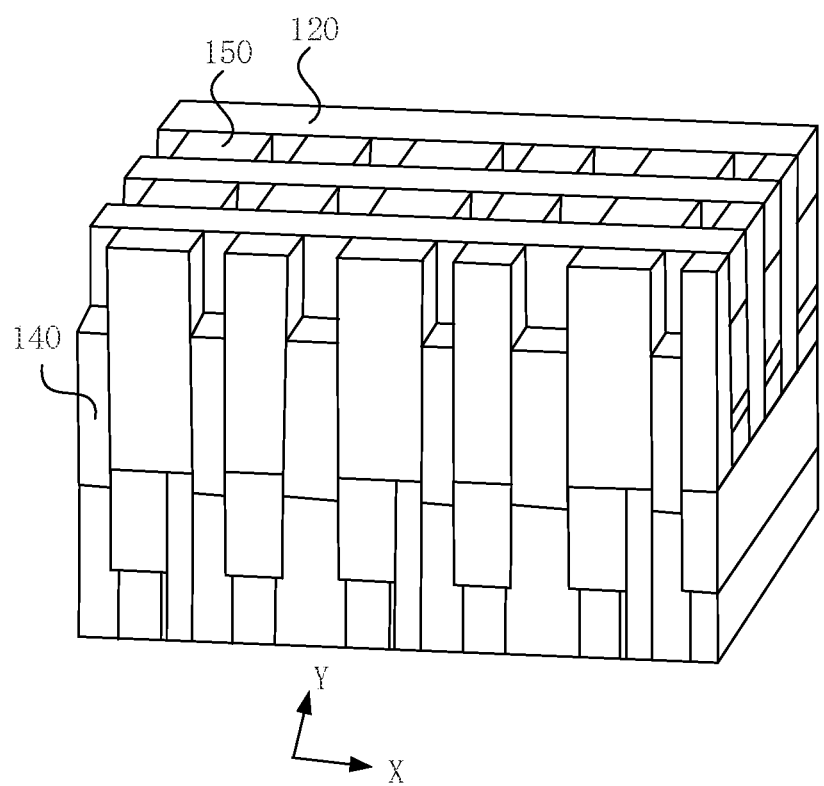

Referring to FIG. 26, FIG. 27, each first capacitor wire 140 is etched back to a preset depth to form a contact hole. At this operation, the air gaps B between the first capacitor wires 140 may be filled with the isolation layer 150, so that the air gaps B may not be enlarged by etching.

Figure 28:
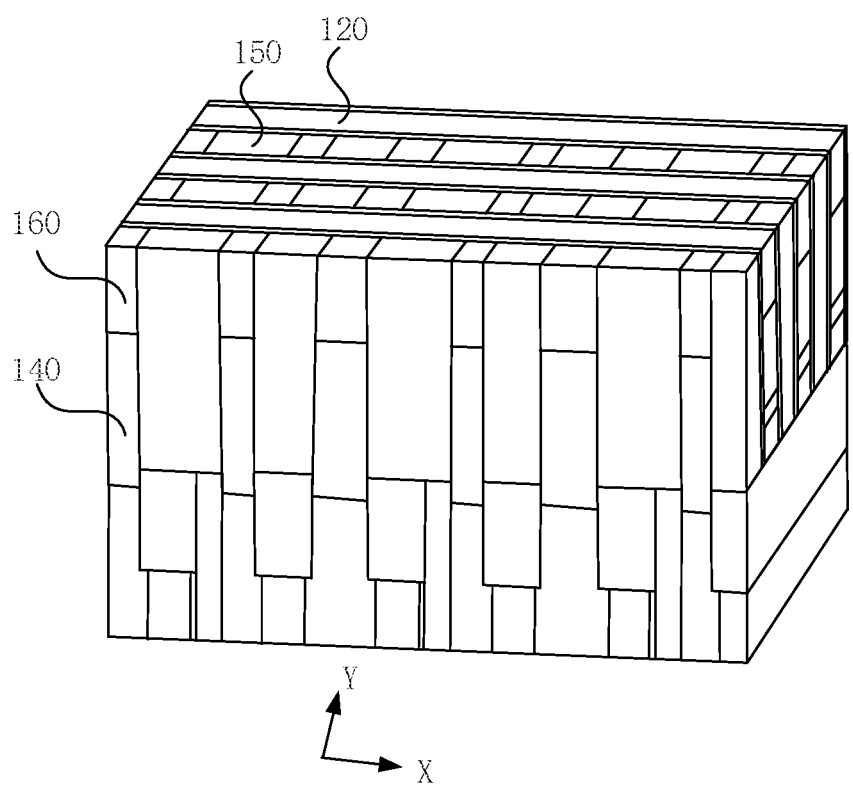
Figure 29:
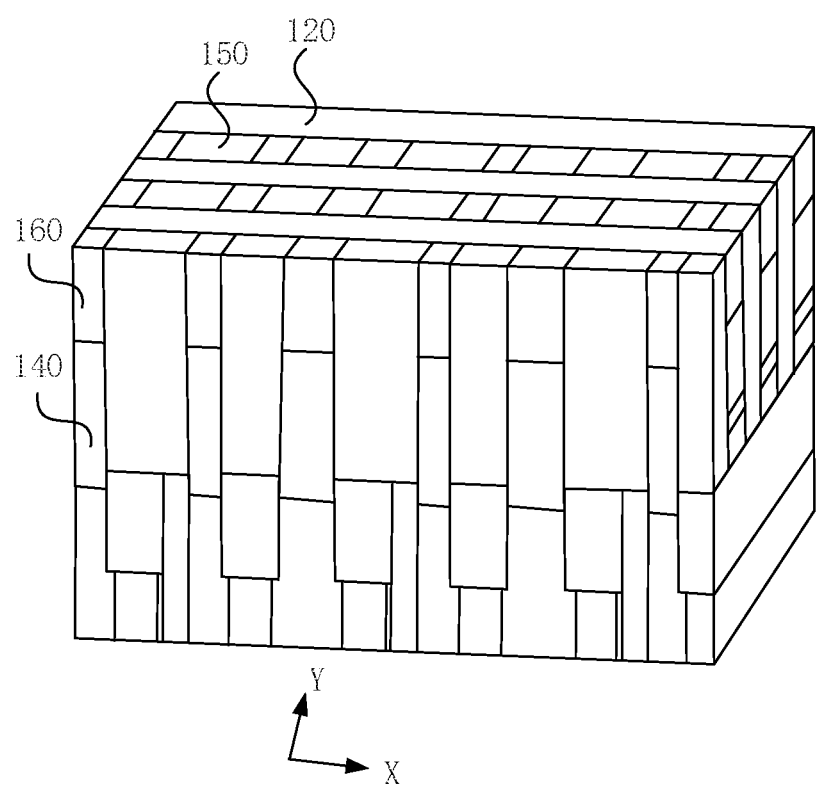

Referring to FIG. 28 and FIG. 29, second capacitor wires 160 are respectively formed in the contact holes. Each of the second capacitor wires 160 is of a conventional structure, and may include a plurality of metal conducting layers. Elaborations are omitted herein.

According to the semiconductor structure manufacturing method provided in the examples of the disclosure, the conducting layer is formed between the bit line structures at first, and then is divided to form the first capacitor wires. An area of a region between the bit line structures is larger than an area of a capacitive contact hole in a related art, so that the deposited conducting layer contacts with the substrate layer more completely, thereby avoiding the incomplete contact between the first capacitor wires and the substrate layer in the related art where the first capacitor wires are formed by depositing the materials directly in the capacitor contact holes. Therefore, the contact resistance is further reduced, and the electrical performance of a semiconductor structure is improved. In addition, the gaps between the first capacitor wires may also be filled with the isolation layer, so that the electrical performance of the first capacitor wires is improved.

In some examples, as shown in FIG. 2, the plurality of bit line structures 120 are arranged on the substrate layer 110 of the semiconductor structure of the disclosure in the first direction (the X direction). There is also provided an example of forming the bit line structure 120 in the semiconductor structure manufacturing method of the disclosure. Specific descriptions will be made below.

Figure 14:
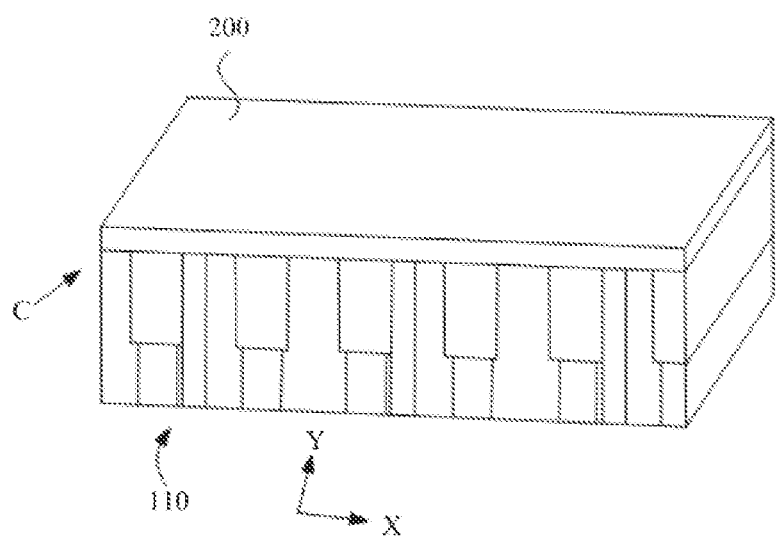

Referring to FIG. 14, the substrate layer 110 is provided, and a bottom plate 200 is formed on the substrate layer 110. The bottom plate 200 may be a nitride layer or an oxide layer. In the example of the disclosure, the bottom plate 200 may be formed by a chemical vapor deposition method. The bottom plate 200 covers the substrate layer 110.

Figure 15:
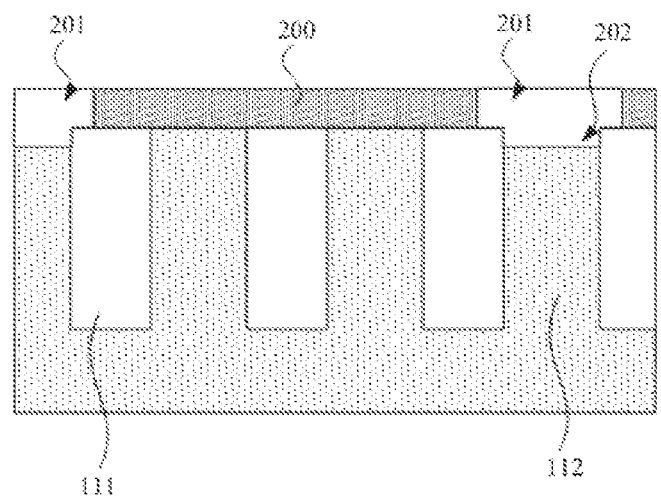
Figure 16:
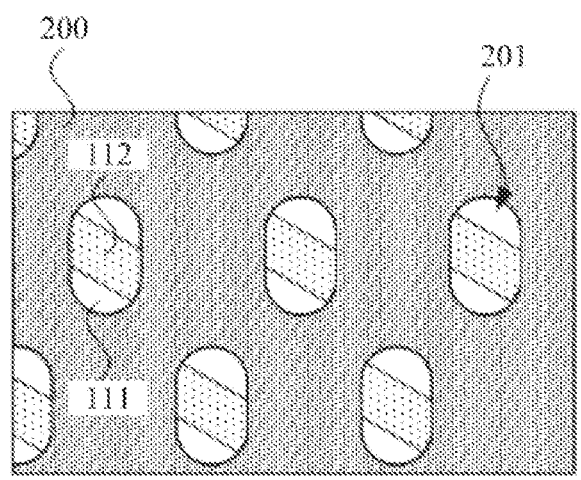

References are made to FIG. 15 and FIG. 16. FIG. 15 is a schematic diagram of a lateral surface C of the structure formed after patterning of a three-dimensional diagram shown in FIG. 14. FIG. 16 is a top view of the structure formed after patterning of the three-dimensional diagram shown in FIG. 14. The bottom plate 200 is patterned to form a plurality of open windows 201. Each open window 201 at least exposes part of an active area 112. In the example, each open window 201 also exposes part of the top surface of a bit line structure 112 and part of a top surface of a shallow trench isolation structure 111.

At this operation, the open windows 201 may be formed by taking the patterned photoresist layer as a mask. A mask layer is formed on the bottom plate 200, the mask layer having a plurality of openings, and a central position of one opening is aligned to a central position where a corresponding open window is required to be formed. Patterns of the mask layer are transferred to the bottom plate 200 by taking the mask layer as a mask to form the open windows 201.

In some examples, after the open windows 201 are formed, the active areas 112 exposed from the open windows 201 are over-etched to make the level of the top surface of an active area 112 lower than that of the top surface of a shallow trench isolation structure 111 to form a groove 202. Formation of the groove 202 may achieve higher contact performance between a bit line contact island 120B that is subsequently formed and the active area 112.

Figure 17:
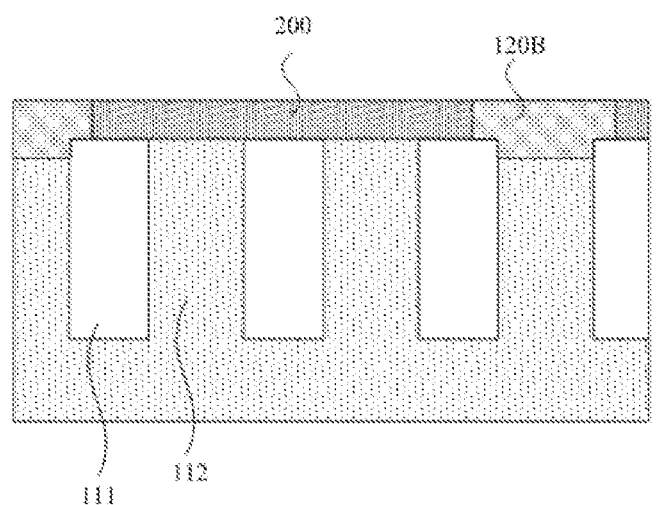

Referring to FIG. 17, the open windows 201 are filled with a conducting material to form the bit line contact islands 120B. In the example, the conducting material is polysilicon. A method for filling with the conducting material may be LPCVD, in which a reaction gas may be $H_3SiN(C_3H_7)_2/Si_2H_6/SiH[N(CH_3)_2]_3$, a reaction temperature may be 380° C. to 500° C., and reaction pressure may be 1 Torr to 3 Torr. At this operation, the conducting material is also deposited in the groove 202. The groove 202 may limit the conducting material to ensure a closer contact between a formed bit line contact island 120B and the corresponding active area 112.

Figure 18:
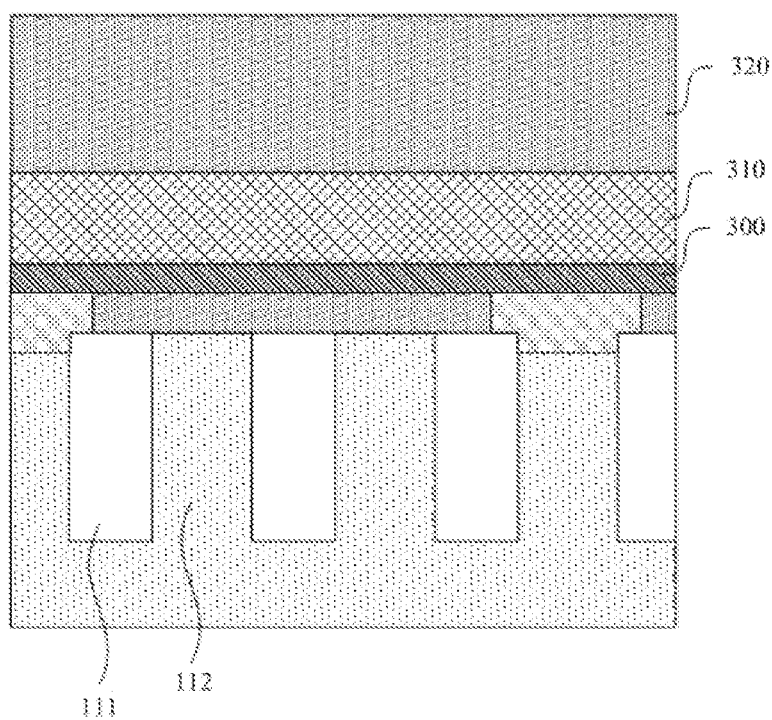
Figure 19:
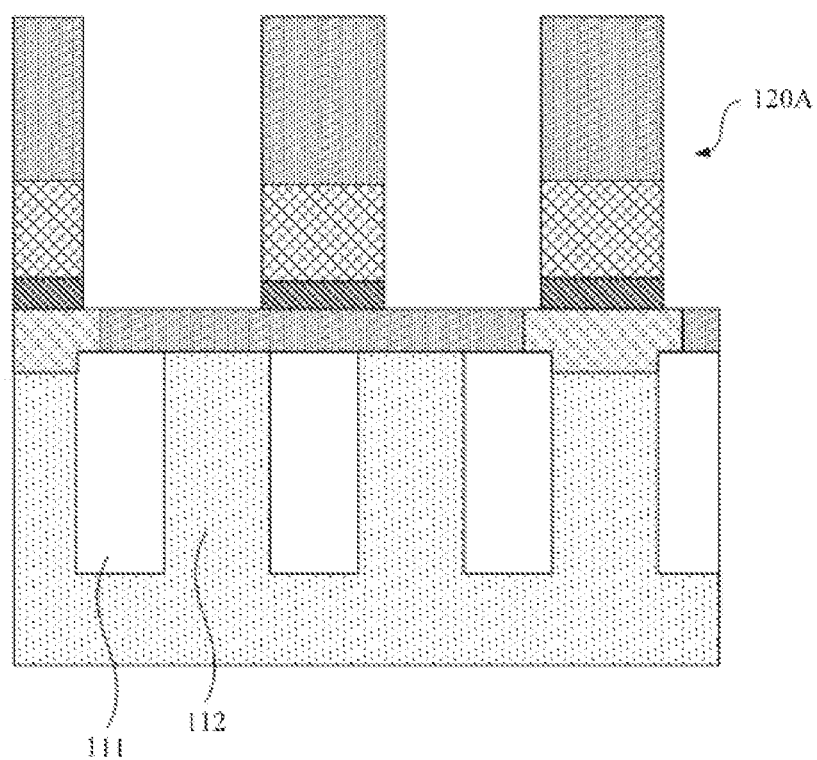

Referring to FIG. 18 and FIG. 19, a plurality of bit lines extending along the first direction and covering part of the bottom plate and the bit line contact islands are formed.

Referring to FIG. 18, the bottom plate 200 and the bit line contact islands 120B are sequentially covered with a bottom conducting layer 300, a top conducting layer 310 and a barrier layer 320. The bottom conducting layer 300 may be metal titanium nitride, the top conducting layer 310 may be metal tungsten, and the barrier layer 320 may be silicon nitride.

Referring to FIG. 19, the barrier layer 320, the top conducting layer 310 and the bottom conducting layer 300 are sequentially patterned to form the plurality of bit lines 120A extending along the first direction (the X direction). The bit lines 120A are arranged at equal intervals. Each connecting line of central points of the open windows 201 in the first direction (the X direction) coincides with each center line of the bit lines 120A, so that a contact area of a bit line 120A and a bit line contact island 120B may be maximized, and the electrical conductivity of the bit line structures 120 may be improved.

The exposed bottom plate 200 and part of the substrate layer 110 under the exposed bottom plate 200 are removed by an etching process until the active area is exposed, to form the bit line structures 120 arranged on the substrate layer 110 in the first direction (as shown in FIG. 2).

The above is some implementation modes of the disclosure. It is to be pointed out that those of ordinary skill in the art may further make a plurality of improvements and embellishments without departing from the principle of the disclosure, and these improvements and embellishments shall also fall within the scope of protection of the disclosure.

The invention claimed is:

1. A semiconductor structure manufacturing method, comprising:
providing a substrate, which comprises a substrate layer and a plurality of bit line structures arranged on the substrate layer in a first direction, the substrate layer comprising shallow trench isolation structures, active areas defined by the shallow trench isolation structures, and a plurality of word line structures arranged in a second direction, wherein the word line structures pass through the shallow trench isolation structures and the active areas, two adjacent bit line structures and two adjacent word line structures define a conductive contact region which exposes a part of a corresponding active area;
forming a conducting layer between the bit line structures, the conducting layer covering the substrate layer, and the conducting layer extending along the first direction;
partially removing the conducting layer with the conducting layer corresponding to the conductive contact region retained to form first capacitor wires; and
forming an isolation layer filling gaps between the first capacitor wires;
wherein a process for forming the bit line structures arranged in the first direction on the substrate layer comprises:
forming a bottom plate on the substrate layer;
patterning the bottom plate to form a plurality of open windows, each open window at least exposing part of the corresponding active area;
filling the open windows with a conducting material to form bit line contact islands;
forming bit lines extending along the first direction and covering part of the bottom plate and the bit line contact islands; and
removing the bottom plate being exposed and an area of the substrate layer under the exposed bottom plate until the active areas are exposed to form the bit line structures.

2. The semiconductor structure manufacturing method of claim 1, wherein, after forming the isolation layer, the method further comprises:
etching back each first capacitor wire to a preset depth to form a contact hole; and
forming a second capacitor wire in the contact hole.

3. The semiconductor structure manufacturing method of claim 1, wherein, before forming the conducting layer between the bit line structures, the method further comprises:
forming a protective layer, the protective layer covering surfaces of the bit line structures and a surface of the substrate layer; and
partially removing part of the protective layer with the protective layer on sidewalls of the bit line structures retained.

4. The semiconductor structure manufacturing method of claim 1, wherein, before forming the conducting layer between the bit line structures, the method further comprises:
etching the substrate layer that is not covered with the bit line structures to remove part of the shallow trench isolation structures to enlarge an area of each active area exposed from the conductive contact regions.

5. The semiconductor structure manufacturing method of claim 1, wherein partially removing the conducting layer with the conducting layer corresponding to the conductive contact region retained to form the first capacitor wires comprises:
forming a patterned photoresist layer on a plane formed by the conducting layer and the bit line structures, the patterned photoresist layer having a plurality of photoresist strips, each photoresist strip extending along the second direction, and each the photoresist strip passing over the conductive contact region;
removing the exposed conducting layer by taking the photoresist strips as a mask; and
removing the photoresist strips to form the first capacitor wires.

6. The semiconductor structure manufacturing method of claim 1, wherein forming the isolation layer filling the gaps between the first capacitor wires, comprises:
filling an isolation layer material in the gaps between the first capacitor wires and covering surfaces of the first capacitor wires and the bit line structures; and removing the isolation layer material on the surfaces of the first capacitor wires and the bit line structures to form the isolation layer.

7. The semiconductor structure manufacturing method of claim 1, wherein patterning the bottom plate to form the open windows comprises:

forming a mask layer on the bottom plate, the mask layer having a plurality of openings, and a central position of each opening being aligned to a central position where a corresponding open window is to be formed; and transferring a pattern of the mask layer to the bottom plate by taking the mask layer as a mask to form the open windows.

8. The semiconductor structure manufacturing method of claim 1, wherein each connecting line of central positions of the open windows in the first direction coincide with each center line of the bit lines.

9. The semiconductor structure manufacturing method of claim 1, wherein, before filling the open windows with the conducting material, the method further comprises:

over-etching the active areas exposed from the open windows to form grooves; and filling the grooves and the open windows with the conducting material to form the bit line contact islands.

10. The semiconductor structure manufacturing method of claim 1, wherein forming the bit lines extending along the first direction and covering part of the bottom plate and the bit line contact islands comprises:

sequentially covering the bottom plate and the bit line contact islands with a bottom conducting layer, a top conducting layer and a barrier layer; and sequentially patterning the barrier layer, the top conducting layer and the bottom conducting layer to form the bit lines extending along the first direction.

* * * * *